(12) United States Patent
Cheng et al.

(10) Patent No.: US 11,469,394 B2
(45) Date of Patent: Oct. 11, 2022

(54) ARRAY SUBSTRATE HAVING ENHANCED LIGHT EXTRACTION EFFICIENCY, PREPARATION METHOD THEREFOR, AND DISPLAY DEVICE

(71) Applicants: Hefei Xinsheng Optoelectronics Technology Co., Ltd., Hefei (CN); BOE TECHNOLOGY GROUP CO., LTD., Beijing (CN)

(72) Inventors: Leilei Cheng, Beijing (CN); Tongshang Su, Beijing (CN); Qinghe Wang, Beijing (CN); Guangyao Li, Beijing (CN); Wei Song, Beijing (CN); Ning Liu, Beijing (CN); Yang Zhang, Beijing (CN); Yongchao Huang, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 62 days.

(21) Appl. No.: 17/051,323

(22) PCT Filed: Mar. 2, 2020

(86) PCT No.: PCT/CN2020/077438
§ 371 (c)(1),
(2) Date: Oct. 28, 2020

(87) PCT Pub. No.: WO2020/192364
PCT Pub. Date: Oct. 1, 2020

(65) Prior Publication Data
US 2021/0074946 A1    Mar. 11, 2021

(30) Foreign Application Priority Data
Mar. 22, 2019   (CN) .......................... 201910222391.4

(51) Int. Cl.
*H01L 29/08*     (2006.01)
*H01L 51/52*     (2006.01)
*H01L 51/56*     (2006.01)

(52) U.S. Cl.
CPC .......... *H01L 51/5237* (2013.01); *H01L 51/56* (2013.01); *H01L 2251/308* (2013.01)

(58) Field of Classification Search
CPC ........................... H01L 51/5237; H01L 51/56
See application file for complete search history.

(56) References Cited

U.S. PATENT DOCUMENTS

| 2007/0096614 A1* | 5/2007 | Shin ..................... H01L 51/5218 313/504 |
| 2008/0138624 A1* | 6/2008 | Lewis ................... C23C 28/345 428/469 |

(Continued)

FOREIGN PATENT DOCUMENTS

| CN | 1328270 A   | 12/2001 |
| CN | 101752404 A | 6/2010  |

(Continued)

OTHER PUBLICATIONS

International Search Report and Written Opinion for International Application No. PCT/CN2020/077438 dated May 29, 2020.

(Continued)

*Primary Examiner* — Caleb E Henry
(74) *Attorney, Agent, or Firm* — Perilla Knox & Hildebrandt LLP; Kenneth A. Knox

(57) ABSTRACT

The present invention relates to the field of display technologies, and provides an array substrate, a manufacturing method thereof, and a display device. The array substrate includes a first electrode layer. The first electrode layer may include an indium tin oxide layer and a planarization layer. The indium tin oxide layer is disposed on a substrate and includes indium tin oxide particles; the planarization layer is (Continued)

disposed on a side of the indium tin oxide layer away from the substrate, and fills at least part of gaps between the indium tin oxide particles, and the planarization layer can conduct electricity.

17 Claims, 2 Drawing Sheets

(56) References Cited

U.S. PATENT DOCUMENTS

| | | | |
|---|---|---|---|
| 2010/0225229 A1* | 9/2010 | Hosoda | H01L 51/5268 313/504 |
| 2012/0127396 A1* | 5/2012 | Tsubata | G02F 1/13458 349/158 |
| 2012/0133860 A1* | 5/2012 | Tsubata | G02F 1/1345 257/E33.061 |
| 2012/0228591 A1* | 9/2012 | Sawabe | H01L 51/56 257/E51.001 |
| 2012/0243077 A1* | 9/2012 | Osawa | H01L 27/14621 359/356 |
| 2013/0287936 A1* | 10/2013 | Jang | H01L 51/5212 428/142 |
| 2013/0334506 A1* | 12/2013 | Tobise | H01L 51/5206 257/40 |
| 2014/0061592 A1 | 3/2014 | Liu et al. | |
| 2016/0005375 A1* | 1/2016 | Naijo | G09G 3/38 359/267 |
| 2017/0222182 A1* | 8/2017 | Mo | H01L 51/524 |
| 2017/0271417 A1* | 9/2017 | Jia | H01L 27/3232 |
| 2017/0331074 A1* | 11/2017 | Wehlus | H01L 51/5234 |
| 2017/0373280 A1* | 12/2017 | Lee | H01L 51/5268 |

FOREIGN PATENT DOCUMENTS

| | | |
|---|---|---|
| CN | 101911332 A | 12/2010 |
| CN | 102629669 A | 8/2012 |
| CN | 103137812 A | 6/2013 |
| CN | 103219433 A | 7/2013 |
| CN | 104576968 A | 4/2015 |
| CN | 108963106 A | 12/2018 |
| CN | 109427819 A | 3/2019 |
| CN | 109817693 A | 5/2019 |
| JP | 2005216705 A | 8/2005 |
| JP | 2012009359 A | 1/2012 |
| TW | 201212327 A | 3/2012 |
| WO | 2011162080 A1 | 12/2011 |

OTHER PUBLICATIONS

First Office Action for CN Patent Application No. 201910222391.4 dated Jun. 18, 2020.

* cited by examiner

ARRAY SUBSTRATE HAVING ENHANCED LIGHT EXTRACTION EFFICIENCY, PREPARATION METHOD THEREFOR, AND DISPLAY DEVICE

CROSS-REFERENCE TO RELATED APPLICATIONS

The present application is based upon International Application No. PCT/CN2020/077438, filed on Mar. 2, 2020, which claims the priority to the Chinese Patent Application NO. 201910222391.4, entitled "ARRAY SUBSTRATE, MANUFACTURING METHOD THEREOF AND DISPLAY DEVICE," filed on Mar. 22, 2019, the entire contents of which are hereby incorporated by reference.

TECHNICAL FIELD

The present disclosure relates to the field of display technologies and, in particular, to an array substrate, a manufacturing method thereof, and a display device.

BACKGROUND

With the rapid development of display technologies, people have increasingly high requirements for displays. An array substrate affects the display effect of a display device.

At present, in the array substrate, when light emitted by an organic light emitting layer propagates in an anode layer and each of organic materials, an optical waveguide effect easily occurs at interfaces between the anode layer and each of the organic materials due to a difference in refractive indexes, resulting in light loss up to about 50%. When the light emitted by the organic light emitting layer reaches the anode layer for light extraction during a transmission process, due to an influence of total reflection of a substrate or air interface, the light with the incident angle greater than the critical angle is totally reflected, and up to about 30% of the light propagates in the substrate without being coupled to the air, so that light extraction efficiency of the array substrate is low.

Therefore, it is necessary to design a new array substrate and its manufacturing method and a display device.

It should be noted that the information disclosed in the Background section above is only for enhancing the understanding of the background of the present disclosure, and thus may include information that does not constitute prior art known to those of ordinary skill in the art.

SUMMARY

The present invention provides an array substrate, a manufacturing method thereof, and a display device.

Additional aspects and advantages of the present invention will be partly set forth in the following description, and partly will become apparent from the description, or may be learned through the practice of the present invention.

According to an aspect of the present invention, an array substrate includes a first electrode layer, and the first electrode layer includes:

an indium tin oxide layer disposed on a substrate and including indium tin oxide particles; and a planarization layer disposed on a side of the indium tin oxide layer away from the substrate, wherein the planarization layer fills at least part of gaps between the indium tin oxide particles, and the planarization layer is electrically conductive.

In an exemplary embodiment of the present disclosure, the array substrate further includes:

an insulating layer disposed between the substrate and the indium tin oxide layer, wherein the indium tin oxide particles are in contact with the insulating layer.

In an exemplary embodiment of the present disclosure, sizes of the indium tin oxide particles at different positions of the indium tin oxide layer are different to change light extraction efficiencies of lights with different wavelengths.

In an exemplary embodiment of the present disclosure, the array substrate includes a light extraction area and a non-light extraction area, and the indium tin oxide layer located in the light extraction area contains the indium tin oxide particles.

In an exemplary embodiment of the present disclosure, a material of the planarization layer includes PEDOT:PSS.

In an exemplary embodiment of the present disclosure, a thickness of the indium tin oxide layer is greater than or equal to 10 nm and less than or equal to 30 nm.

In an exemplary embodiment of the present disclosure, the array substrate further includes:

an organic light emitting layer disposed on a side of the planarization layer away from the indium tin oxide layer;

a second electrode layer disposed on a side of the organic light emitting layer away from the planarization layer; and an encapsulation layer disposed on a side of the second electrode layer away from the organic light emitting layer.

According to an aspect of the present disclosure, there is provided a manufacturing method for an array substrate, including: providing a substrate and forming a first electrode layer on the substrate, wherein the step of forming a first electrode layer on the substrate includes:

forming an indium tin oxide layer on the substrate, and granulating the indium tin oxide layer to form indium tin oxide particles;

forming a planarization layer on a side of the indium tin oxide layer away from the substrate, wherein the planarization layer fills at least part of gaps between the indium tin oxide particles, and the planarization layer is electrically conductive.

In an exemplary embodiment of the present disclosure, before the step of forming an indium tin oxide layer on the substrate, and granulating the indium tin oxide layer to form indium tin oxide particles, the manufacturing method for the array substrate further includes:

forming an insulating layer on the substrate, wherein the indium tin oxide particles are in contact with the insulating layer.

In an exemplary embodiment of the present disclosure, the step of forming an indium tin oxide layer on the substrate, and granulating the indium tin oxide layer to form indium tin oxide particles includes:

etching the indium tin oxide layer by using dilute hydrochloric acid with a preset concentration for a preset time to obtain the indium tin oxide particles.

In an exemplary embodiment of the present disclosure, the step of forming a planarization layer on a side of the indium tin oxide layer away from the substrate includes:

forming the planarization layer on the side of the indium tin oxide layer away from the substrate by using a liquid PEDOT:PSS material via an inkjet process.

In an exemplary embodiment of the present disclosure, after the step of forming a first electrode layer, the manufacturing method for the array substrate further includes:

forming an organic light emitting layer on a side of the planarization layer away from the indium tin oxide layer;

forming a second electrode layer on a side of the organic light emitting layer away from the planarization layer;

forming a encapsulation layer on a side of the second electrode layer away from the organic light emitting layer.

According to an aspect of the present disclosure, there is provided a display device including:

the array substrate of any one of the above.

BRIEF DESCRIPTION OF THE DRAWINGS

The above and other features and advantages of the present invention will become more apparent by describing in detail exemplary embodiments thereof with reference to the accompanying drawings.

DETAILED DESCRIPTION

Figure 1:
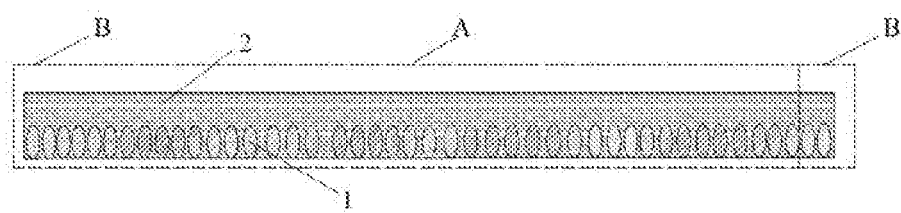
FIG. 1 is a schematic structural diagram of a first electrode layer in an embodiment of the present invention.

Exemplary embodiments will now be described more fully with reference to the accompanying drawings. However, the embodiments can be implemented in a variety of forms and should not be construed as being limited to the examples set forth herein; rather, these embodiments are described such that the present disclosure will be more complete so as to convey the idea of the exemplary embodiments to those skilled in this art. The same reference numerals in the drawings denote the same or similar parts, and the repeated description thereof will be omitted.

The present invention first provides an array substrate. As shown in FIG. 1, the array substrate includes a first electrode layer. The first electrode layer may include an indium tin oxide layer 1 and a planarization layer 2. The indium tin oxide layer 1 is disposed on a substrate 3, which includes indium tin oxide particles; the planarization layer 2 is disposed on a side of the indium tin oxide layer 1 away from the substrate 3, and the planarization layer 2 fills at least part of gaps between the indium tin oxide particles. The planarization layer 2 can conduct electricity. The indium tin oxide particles have electrode characteristics, which improves the transmittance and enhances light extraction efficiency of the array substrate. In this exemplary embodiment, the indium tin oxide in the first electrode layer of the array substrate is granulated to form the granulated indium tin oxides to form a microcavity, and the conductive planarization layer 2 is disposed on a side of the indium tin oxide particles away from the substrate 3. The planarization layer 2 and the indium tin oxide layer 1 together constitute the first electrode layer. Through a microcavity effect, an optical waveguide effect between an organic light emitting layer and the first electrode layer in the prior art is solved, thereby improving the light extraction efficiency of the array substrate.

In this exemplary embodiment, the first electrode layer may serve as an anode layer of an organic electroluminescence device.

Figure 2:
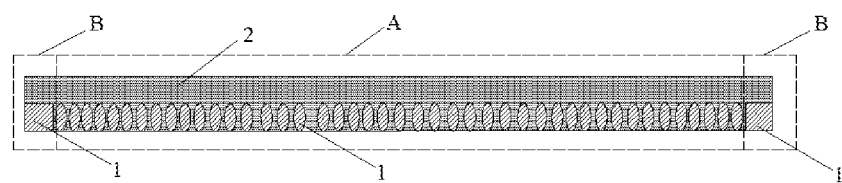
FIG. 2 is a schematic structural diagram of a first electrode layer when indium tin oxide particles are only disposed in a light extraction area in an embodiment of the present invention.
Figure 5:
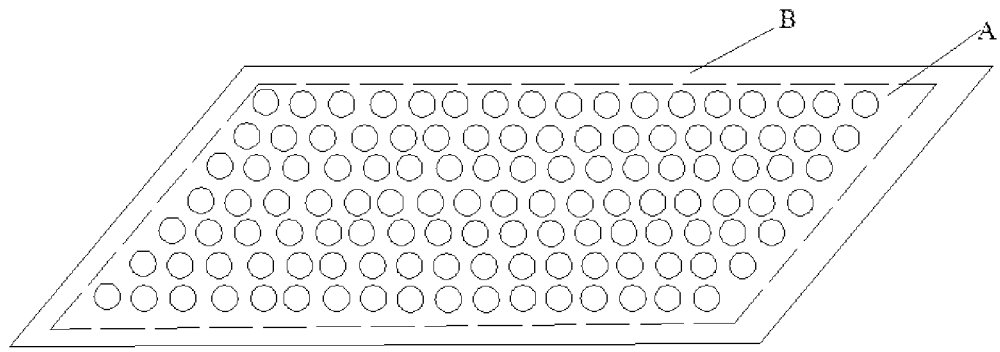
FIG. 5 is a schematic structural plan view of an indium tin oxide layer when indium tin oxide particles are only disposed in a light extraction area in an embodiment of the present invention.
Figure 6:
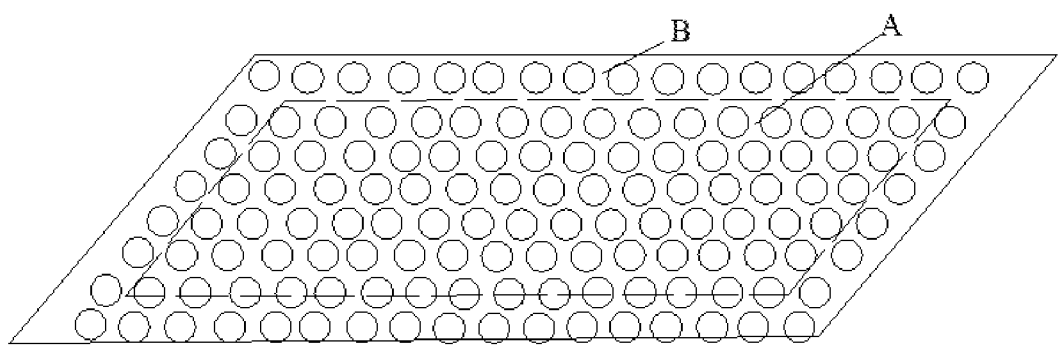
FIG. 6 is a schematic structural plan view of an indium tin oxide layer when the indium tin oxide layer is fully granulated in an embodiment of the present invention.

In this exemplary embodiment, the array substrate can be divided into a light extraction area A and a non-light-extraction area B. The indium tin oxide layer 1 of the light extraction area A can be disposed as the granular indium tin oxide, and the size of the granular indium tin oxide is on an order of nm, and the indium tin oxide particles can be spherical particles or particles of other shapes, which is not particularly limited here. As shown in FIGS. 1 and 6, the indium tin oxide layer 1 in the non-light-extraction area B can be disposed as the indium tin oxide particles; as shown in FIGS. 2 and 5, the indium tin oxide layer 1 in the non-light-extraction area B can also not be processed with keeping an original whole-layer structure.

A thickness of the indium tin oxide layer 1 may be about 10 nm, or about 30 nm, or any thickness greater than 10 nm and less than 30 nm, which is not specifically limited here.

Figure 3:
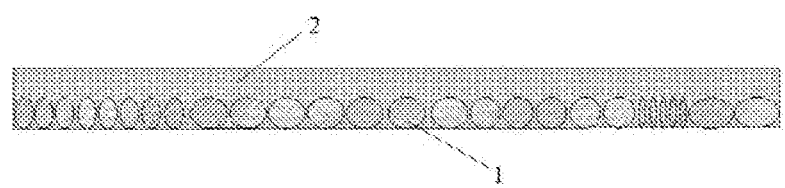
FIG. 3 is a schematic structural diagram of a first electrode layer when sizes of indium tin oxide particles in different regions of an indium tin oxide layer are different in an embodiment of the present invention.

Referring to FIG. 3, the indium tin oxide particles can be obtained by etching an entire flat indium tin oxide layer 1, and the flat indium tin oxide layer 1 can be etched by a hydrochloric acid solution. The size of the granular indium tin oxide is adjusted by changing a concentration of the hydrochloric acid solution and etching time according to different light extraction efficiency requirements by the different sub-pixels, so that the light extraction efficiencies of lights with different main wavelengths is changed by the different sizes of the indium tin oxide particles, thereby improving the quality of the array substrate.

The planarization layer 2 is disposed on the side of the indium tin oxide layer 1 away from the substrate 3, can conduct electricity, and forms the first electrode layer together with the indium tin oxide layer 1. A material of the planarization layer 2 can be PEDOT:PSS (poly(3,4-ethylenedioxythiophene)-polystyrene sulfonic acid), which has good transmittance and conductivity to play a role of an auxiliary electrode, thereby improving the quality of the array substrate. The material of the planarization layer 2 can also be other materials with high transmittance and high conductivity, which are not specifically limited here. The first electrode layer is composed of PEDOT:PSS and the indium tin oxide layer 1, which can achieve a semi-reflective effect.

Figure 4:
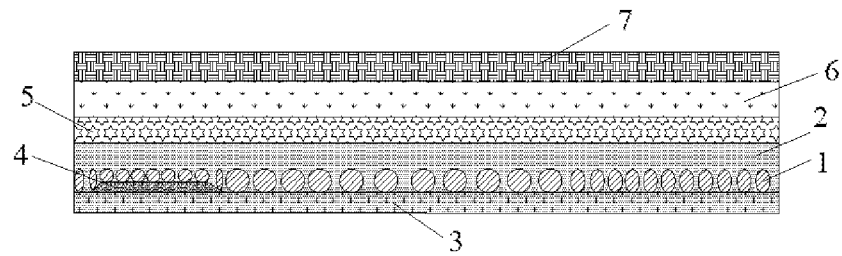
FIG. 4 is a schematic structural diagram of an array substrate of the present invention.

Referring to FIG. 4, the array substrate may further include a thin film transistor 4, and the thin film transistor 4 may be disposed between the substrate 3 and the first electrode layer.

The array substrate may also include an organic light emitting layer 5, a second electrode layer 6 and an encapsulation layer 7. The organic light emitting layer 5 is disposed on a side of the planarization layer 2 away from the indium tin oxide layer 1; the second electrode layer 6 is disposed on a side of the organic light emitting layer 5 away from the planarization layer 2; and the encapsulation layer 7 is disposed on a side of the second electrode layer 6 away from the organic light emitting layer 5.

In an exemplary embodiment, the second electrode layer 6 may be a cathode layer of the organic electroluminescence device.

In another exemplary embodiment, the array substrate may further include an insulating layer, the insulating layer is disposed between the substrate and the indium tin oxide layer, and the granular indium tin oxide is in contact with the insulating layer. A material of the insulating layer can be organic, which can achieve a function of planarizing the substrate.

Further, the present invention also provides a manufacturing method for an array substrate, which may include the following steps:

In step S110, a substrate 3 is provided.

In step S120, an indium tin oxide layer 1 is formed on the substrate 3, and the indium tin oxide layer 1 is granulated to form indium tin oxide particles.

In step S130, a planarization layer is formed on a side of the indium tin oxide layer away from the substrate, and the planarization layer fills at least part of gaps between the indium tin oxide particles, and the planarization layer can conduct electricity.

The above steps are described in detail below;

In the step S110, the substrate 3 is provided.

In the step S120, the indium tin oxide layer 1 is formed on the substrate 3, and the indium tin oxide layer 1 is granulated to form the indium tin oxide particles.

In this exemplary embodiment, the array substrate can be divided into a light extraction area A and a non-light-extraction area B. The indium tin oxide layer 1 of the light extraction area A is granulated to form the indium tin oxide particles, and the size of the granular indium tin oxide is on an order of nm. As shown in FIGS. 1 and 6, the indium tin oxide layer 1 in the non-light-extraction area B can be disposed as the indium tin oxide particles; as shown in FIGS. 2 and 5, the indium tin oxide layer 1 in the non-light extraction area B can also not be processed with keeping an original whole-layer structure.

A thickness of the indium tin oxide layer 1 may be about 10 nm, or about 30 nm, or any thickness greater than 10 nm and less than 30 nm, which is not specifically limited here.

Referring to FIG. 3, the indium tin oxide particles can be obtained by etching an entire flat indium tin oxide layer 1, and the flat indium tin oxide layer 1 can be etched by a hydrochloric acid solution. The size of the granular indium tin oxide is adjusted by changing a concentration of the hydrochloric acid solution and etching time according to different light extraction efficiency requirements by the different sub-pixels, so that the light extraction efficiencies of lights with different main wavelengths is changed by the different sizes of the indium tin oxide particles, thereby improving the quality of the array substrate. The indium tin oxide layer is etched with the dilute hydrochloric acid of a preset concentration for a preset time to obtain the granular indium tin oxide. A hydrochloric acid solution with the preset concentration of 5% can be used to etch the indium tin oxide layer 1 for 120 s, or a hydrochloric acid solution with the preset concentration of 30% can be used to etch the indium tin oxide layer 1 for 30 s, or a hydrochloric acid solution with the preset concentration greater than 5% and less than 30% can be used to etch the indium tin oxide layer 1 for 30 s to 120s; the concentration of the hydrochloric acid solution and the etching time of the indium tin oxide layer 1 can be adjusted according to the size of the granular indium tin oxide. After the etching is over, it can be rinsed with deionized water, or other cleaning equipment can be used, as long as the dilute hydrochloric acid can be cleaned, there is no specific limitation here.

In the step S130, the planarization layer is formed on the side of the indium tin oxide layer away from the substrate, and the planarization layer fills at least part of gaps between the indium tin oxide particles, and the planarization layer can conduct electricity.

Referring to FIG. 3, the planarization layer 2 is disposed on the side of the indium tin oxide layer 1 away from the substrate 3, fills at least part of the gaps between the indium tin oxide particles and forms the first electrode layer together with the indium tin oxide layer 1. The material of the planarization layer 2 can be PEDOT:PSS, which has good transmittance and conductivity to play a role of an auxiliary electrode, thereby improving the quality of the array substrate. The material of the planarization layer 2 can also be other materials with high transmittance and high conductivity, which are not specifically limited here.

The manufacturing of the planarization layer 2 can be manufactured by a coating or inkjet printing process. Compared with the deposition of the prior art, the process method of the present invention is simple and the equipment cost is lower. Roughness of the planarization layer manufactured by the coating or inkjet printing process is high.

Referring to FIG. 4, before the step of forming a first electrode layer, the manufacturing method for the array substrate further includes: forming a thin film transistor 4 on the substrate 3 that is, the thin film transistor 4 is located between the first electrode layer and the substrate 3, and the thin film transistor 4 may also be disposed between the second electrode layer 6 and the encapsulation layer 7.

The manufacturing method for the array substrate may further include forming an organic light emitting layer 5 on a side of the planarization layer 2 away from the indium tin oxide layer 1 by evaporation, forming a second electrode layer 6 on a side of the organic light emitting layer 5 away from the planarization layer 2 by evaporation, and forming an encapsulation layer 7 on a side of the second electrode layer 6 away from the organic light emitting layer 5 by evaporation.

The manufacturing of the first electrode layer can be manufactured at room temperature, and then the solvent is evaporated to be dry to complete the manufacturing at a temperature greater than or equal to 30 degrees Celsius and less than or equal to 80 degrees Celsius. The process temperature is low, and the application product field is wide. The process conditions of the manufacturing method for the array substrate of the present invention is easier to obtain and can be applied in technical fields such as flexible displays and wearable displays.

In another exemplary embodiment, the indium tin oxide layer is formed on the substrate. The manufacturing method for the array substrate may further include forming the insulating layer on the substrate, the indium tin oxide layer is in contact with the insulating layer, and the material of the insulating layer may be organic, which can achieve the function of planarizing the substrate.

In addition, the present disclosure also provides a display device including the above array substrate. A detailed structure of the array substrate has been described in detail above, so it will not be repeated here. The display device may include any product or component having a display function, such as a LCD panel, a LCD TV, a monitor, an OLED panel, an OLED TV, an electronic paper display device, a mobile phone, a tablet computer, a notebook computer, a digital photo frame, a navigator, and the like, which is not limited by the embodiments of the present disclosure.

The features, structures, or characteristics described above may be combined in any suitable manner in one or more embodiments, and the features discussed in the various embodiments are interchangeable, if possible. In the description above, numerous specific details are set forth to provide a thorough understanding of the embodiments of the present disclosure. However, those skilled in the art will appreciate that the technical solution of the present disclosure may be practiced without one or more of the specific details, or other methods, components, materials, and the like may be employed. In other instances, well-known structures, materials or operations are not shown or described in detail to avoid obscuring various aspects of the present disclosure.

The terms "about" and "approximately" used in the present specification usually means within 20% of a given value or range, preferably within 10%, and more preferably within 5%. A given quantity here is an approximate quantity, which means that the meaning of "about" and "approximately" can still be implied in the absence of specific instructions.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described "above" will become the component "below." When a structure is "on" another structure, it may mean that a structure is integrally formed on another structure, or that a structure is "directly" disposed on another structure, or that a structure is "indirectly" disposed on another structure through other structures.

In the present specification, the terms "one", "a", "the", "said", and "at least one" are used to indicate that there are one or more elements/components or the like; the terms "include," "contain," and "have" are used to indicate an open meaning of including and means that there may be additional elements/components/etc. in addition to the listed elements/components/etc.

It should be understood that the present disclosure is not limited to the detailed structure and arrangement of the components proposed by the present specification. The present disclosure is capable of having other embodiments, and be carried out and implemented in various manners. The foregoing variations and modifications fall within the scope of the present disclosure. It should be understood that the present disclosure disclosed and defined by the present specification extends to all alternative combinations of two or more of the individual features apparent or recited herein and/or in the drawings. All of these various combinations constitute a number of alternative aspects of the present disclosure. The embodiments described in the present specification are illustrative of the best mode for carrying out the present invention and will enable those skilled in the art to utilize the present disclosure.

What is claimed is:

1. An array substrate, comprising a first electrode layer, wherein the first electrode layer comprises:
   an indium tin oxide layer disposed on a substrate and comprising indium tin oxide particles; and
   a planarization layer disposed on a side of the indium tin oxide layer away from the substrate, wherein the planarization layer is filled in at least part of gaps between the indium tin oxide particles, and the planarization layer is electrically conductive,
   wherein the indium tin oxide particles have different sizes at different positions of the indium tin oxide layer to change light extraction efficiencies of lights with different wavelengths.

2. The array substrate according to claim 1, wherein the array substrate further comprises: an insulating layer, disposed between the substrate and the indium tin oxide layer, wherein the indium tin oxide particles are in contact with the insulating layer.

3. The array substrate according to claim 1, wherein the array substrate comprises a light extraction area and a non-light extraction area, and the indium tin oxide layer located in the light extraction area has the indium tin oxide particles.

4. The array substrate according to claim 1, wherein a material of the planarization layer comprises PEDOT:PSS.

5. The array substrate according to claim 1, wherein a thickness of the indium tin oxide layer is greater than or equal to 10 nm and less than or equal to 30 nm.

6. The array substrate according to claim 1, wherein the array substrate further comprises:
   an organic light emitting layer, disposed on a side of the planarization layer away from the indium tin oxide layer;
   a second electrode layer, disposed on a side of the organic light emitting layer away from the planarization layer; and
   an encapsulation layer, disposed on a side of the second electrode layer away from the organic light emitting layer.

7. A manufacturing method for an array substrate, comprising:
   providing a substrate; and
   forming a first electrode layer on the substrate, wherein forming the first electrode layer on the substrate comprises:
   forming an indium tin oxide layer on the substrate, and granulating the indium tin oxide layer to form indium tin oxide particles; and
   forming a planarization layer on a side of the indium tin oxide layer away from the substrate, wherein the planarization layer is filled in at least part of gaps between the indium tin oxide particles, and the planarization layer is electrically conductive,
   wherein the indium tin oxide particles have different sizes at different positions of the indium tin oxide layer to change light extraction efficiencies of lights with different wavelengths.

8. The manufacturing method for the array substrate according to claim 7, wherein, before forming the indium tin oxide layer on the substrate and granulating the indium tin oxide layer to form indium tin oxide particles, the manufacturing method for the array substrate further comprises: forming an insulating layer on the substrate, wherein the indium tin oxide particles are in contact with the insulating layer.

9. The manufacturing method for the array substrate according to claim 7, wherein forming the indium tin oxide layer on the substrate and granulating the indium tin oxide layer to form indium tin oxide particles comprises: etching the indium tin oxide layer by using dilute hydrochloric acid with a preset concentration for a preset time to obtain the indium tin oxide particles.

10. The manufacturing method for the array substrate according to claim 7, wherein forming the planarization layer on the side of the indium tin oxide layer away from the substrate comprises: forming the planarization layer on the side of the indium tin oxide layer away from the substrate by using a liquid PEDOT:PSS material via an inkjet process.

11. The manufacturing method for the array substrate according to claim 7, wherein, after forming the first electrode layer, the manufacturing method for the array substrate further comprises:

forming an organic light emitting layer on a side of the planarization layer away from the indium tin oxide layer;

forming a second electrode layer on a side of the organic light emitting layer away from the planarization layer; and forming a encapsulation layer on a side of the second electrode layer away from the organic light emitting layer.

12. A display device, comprising:
an array substrate comprising a first electrode layer, wherein the first electrode layer comprises:
an indium tin oxide layer disposed on a substrate and comprising indium tin oxide particles; and
a planarization layer disposed on a side of the indium tin oxide layer away from the substrate, wherein the planarization layer is filled in at least part of gaps between the indium tin oxide particles, and the planarization layer is conductive,
wherein the indium tin oxide particles have different sizes at different positions of the indium tin oxide layer to change light extraction efficiencies of lights with different wavelengths.

13. The display device according to claim 12, wherein the array substrate further comprises an insulating layer disposed between the substrate and the indium tin oxide layer, wherein the indium tin oxide particles are in contact with the insulating layer.

14. The display device according to claim 12, wherein the array substrate comprises a light extraction area and a non-light extraction area, and the indium tin oxide layer located in the light extraction area has the indium tin oxide particles.

15. The display device according to claim 12, wherein a material of the planarization layer comprises PEDOT:PSS.

16. The display device according to claim 12, wherein a thickness of the indium tin oxide layer is greater than or equal to 10 nm and less than or equal to 30 nm.

17. The display device according to claim 12, wherein the array substrate further comprises:
an organic light emitting layer disposed on a side of the planarization layer away from the indium tin oxide layer;
a second electrode layer disposed on a side of the organic light emitting layer away from the planarization layer; and
an encapsulation layer disposed on a side of the second electrode layer away from the organic light emitting layer.

* * * * *